United States Patent [19]
Rona

[11] Patent Number: 4,706,251
[45] Date of Patent: Nov. 10, 1987

[54] VOLTAGE TUNABLE COHERENT LIGHT SOURCE

[75] Inventor: Mehmet Rona, Belmont, Mass.

[73] Assignee: Arthur D. Little, Inc., Cambridge, Mass.

[21] Appl. No.: 713,248

[22] Filed: Mar. 18, 1985

[51] Int. Cl.$^4$ .............................................. H01S 3/19
[52] U.S. Cl. ........................................ 372/4; 357/17; 357/23.1; 372/20; 372/44; 372/96
[58] Field of Search ............... 372/4, 43, 44, 20, 96; 357/23.1, 17

[56] References Cited

PUBLICATIONS

D. C. Tsui et al., "Far Infrared Emission From Plasma Oscillations of Si Inversion Layers", Solid State Communications, vol. 35, pp. 875–877 (Pergamon Press Ltd. 1980).

Primary Examiner—James W. Davie
Attorney, Agent, or Firm—George W. Dishong

[57] ABSTRACT

The disclosed source of coherent radiation is of the type adapted to provide an inversion layer of electrons. The preferred embodiment comprises a grated MOSFET having gallium arsenide or indium antimonide substrate so as to provide a source which is (1) operable at room temperatures, and (2) self-exciting in response to predetermined, substantially constant DC current levels of gate voltage and source-drain voltage.

7 Claims, 13 Drawing Figures

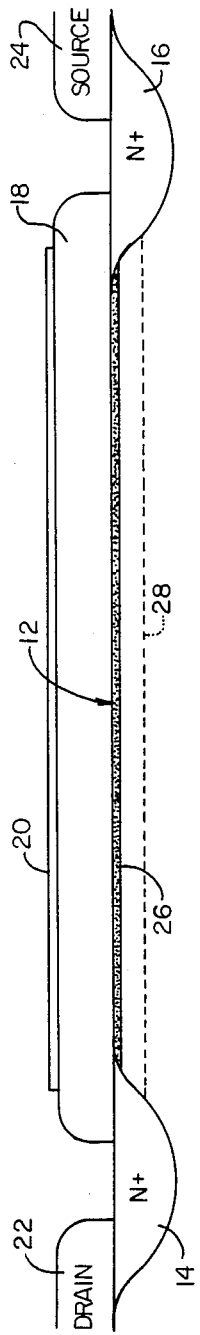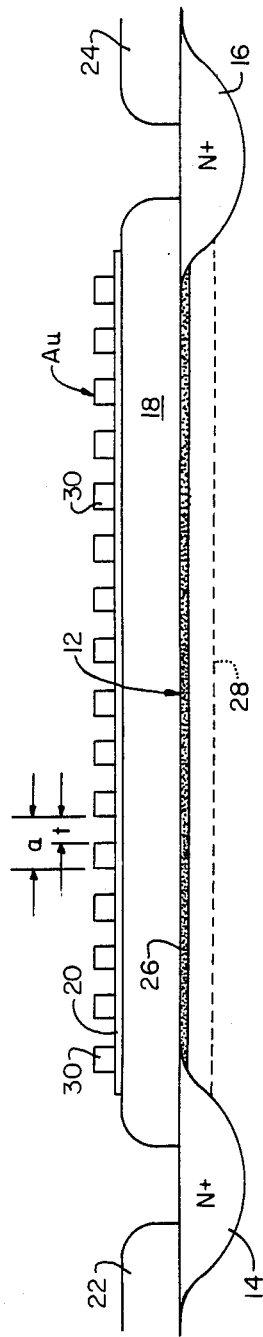
FIG. 1 Prior Art
FIG. 2

VOLTAGE TUNABLE COHERENT LIGHT SOURCE

This invention was made with Government support under Department of the Army Harry Diamond Laboratories (HDL) Contract No. DAAK21-82-C-0083. The Government has certain rights in this invention.

BACKGROUND OF THE INVENTION

1. Field of the Invention

The present invention generally relates to sources of coherent electromagnetic radiation and more particularly to improved solid-state devices capable of emitting coherent electromagnetic radiation at a frequency which is voltage controlled.

2. Description of the Related Art

In a recent publication entitled "Far Infrared Emission from Plasma Oscillations of Silicon Inversion Layers" by Tsui, D. C.; Gornik, E.; and Logan, R. A., published in the Solid State Communications of Volume 35, pp. 875-877; (Pergamon Press, Ltd.). The authors describe a source of coherent far infrared radiation. The source is provided by depositing a gold grating having a periodic spacing on the thin optically semitransparent titanium film gate electrode of a standard metal-oxide-semiconductor field-effect-transistor (MOSFET) having a silicon substrate. A gate voltage is applied to the gate electrode and the source-drain voltage is pulsed to excite the device into oscillation.

More particularly, the silicon substrate of a standard MOSFET is a p-type semiconductor material. The source and drain terminals of a standard device are usually respectively connected to two n-type regions formed by phosphor diffusion in the surface of the silicon substrate and spaced from one another. An insulating oxide layer of silicon oxide is formed on the substrate between the n-type regions, and a thin electrically conductive titanium layer is disposed on the oxide layer opposite the silicon substrate to form the gate electrode of the device. As is well known when a voltage is applied to the gate electrode thereby creating a potential between the gate electrode and the silicon substrate, electrons accumulate at the surface of the silicon substrate to form an inversion layer. Even though electrons are a minority in the bulk of the p-type silicon substrate, they become majority carriers on the surface, because of the high positive gate bias voltage potential applied across the insulating silicon oxide layer. Between this sheet of electrons under the gate and the p-type bulk, there is a gradual transition from the degenerate n-type surface characteristics of the inversion layer to the nondegenerate p-type (semiconducting) bulk. This gradual transition region is referred to as the depletion layer. In the depletion layer the electrons and holes are roughly in equal orders of magnitude of density and the material is highly resistant. The application of a sufficiently positive D.C. voltage to the gate electrode will increase the charge density of the inversion layer and thus make the inversion layer highly conductive. Under these circumstances a D.C. source-drain voltage would result in a high source drain current. A decrease of the gate voltage will conversely decrease the charge density of the inversion layer thereby decreasing the number of carrier electrons in the inversion layer. Thus, a smaller amount of drain current will flow at the same source-drain voltage.

For a sufficiently high positive D.C. gate voltage the inversion layer is in the order of 100 Angstroms thick. Since the surface area between the drain and source n-type regions are much larger than the thickness of this layer, the collection of electrons forming this layer can be thought of as a two-dimensional conductive layer with an adjustable current density.

It is known that the inversion layer, a two-dimensional plasma, can be excited into an oscillatory state by providing a pulsed signal between the source and drain terminals so as to create a two-dimensional plasmon. By providing a gold grating on the semitransparent gate electrode, an electric field couples the plasmon with electrons in the grating resulting in radiative decay of the two-dimensional plasmon and far infrared emission from the grating. The coherency of the emitted radiation is dependent upon achieving a constant charge density in the inversion layer, while the particular frequency of the coherent radiation emitted by the grating is a function of the total portion of the depletion layer in which a constant charge density is achieved. The total portion of the depletion layer in which a constant charge density is achieved is in turn dependent upon the gate voltage and the level of the source-drain current provided.

The reported observation of emission of coherent far infrared radiation from a grating-gated, large area, silicon-based MOSFET by Tsui et al is not suitable for commercial applications. Its main drawback is that the observations of coherent emission by the authors were made at liquid helium temperatures and not near or at room temperatures. The theory disclosed hereinafter, behind the silicon based MOSFET device, shows that for the long wavelength infrared region of the electromagnetic spectrum, the grating-gated, silicon substrated MOSFET has a maximum operational temperature of 150° K well below room temperatures. Not having the theory explaining the phenomenon, Tsui et al could not develop a system which is operable at room temperatures which would also be self-exciting in response to predetermined levels of substantially constant D.C. voltage applied to the gate and source drain terminals.

SUMMARY OF THE INVENTION

Accordingly, a general object of the present invention is to provide an improved source of coherent electromagnetic radiation which substantially reduces or overcomes the problems associated with the prior art Another object of the present invention is to provide an improved source of coherent radiation of the type adapted to operate in an electron accumulation mode and provide oscillating plasma waves which are self-exciting without the need for additional external circuitry.

And another object of the present invention is to provide an improved MOSFET and/or heterojunction type source of coherent electromagnetic radiation operable near or at room temperatures.

Yet another object of the present MOSFET and/or heterojunction invention and having an improved power output.

These and other objects are provided by a device operable to create an inversion layer of electrons, the layer providing self-exciting plasmons near or at room temperatures. The device is better understood by first developing the theory behind the operation of the silicon MOSFET and/or heterojunction type source and modifying the prior art source to provide a self-sustaining source of coherent electromagnetic radiation at room temperatures. In particular, as a result of the theory of operation developed herein, it will be shown that such results are achieved by providing a gallium arsenide substrate on which the grating-gated MOSFET and/or heterojunction structure is fabricated.

Other objects of the invention will in part be obvious and will in part appear hereinafter. The invention accordingly comprises the apparatus possessing the construction, combination of elements, and arrangement of parts which are exemplified in the following detailed disclosure, and the scope of the application of which will be indicated in the claims.

For a fuller understanding of the nature and objects of the present invention, reference should be had to the following detailed description taken in connection with the accompanying drawings wherein:

BRIEF DESCRIPTION OF THE DRAWINGS

FIG. 1 is a cross-sectional view of a typical prior art silicon-base MOSFET;

FIG. 2 is a cross-sectional view of the MOSFET and/or heterojunction structure provided with a grating structure in accordance with Tsui et al and in accordance with the preferred embodiment of the present invention;

DESCRIPTION OF THE PREFERRED EMBODIMENT

Figure 3:
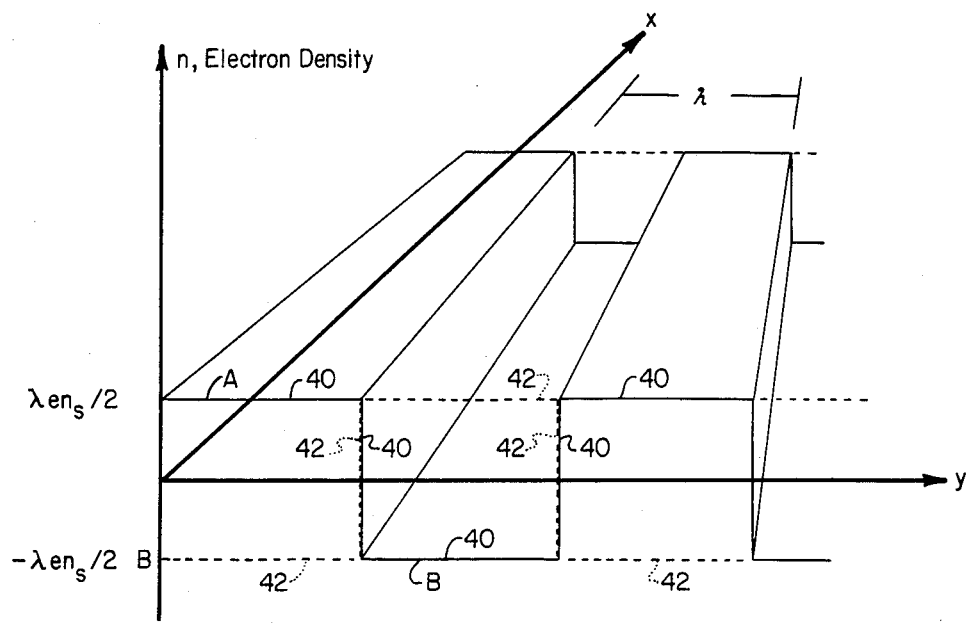
FIG. 3 shows a three-dimensional graphical depiction of substantially the type of plasma standing waves created in the structure of FIG. 2.

In developing the theory of the present invention it is important to first understand the basic operation of a typical silicon-base MOSFET and/or heterojunction.

As shown in FIG. 1 the gating structure is fabricated on a silicon substrate 10. The substrate 10 is generally a p-type semiconductive material. The source and drain terminals are in part formed by diffusing for example, phosphor into the surface 12 of the substrate so as to form two spaced-apart n-type regions 14 and 16 in the surface. An electrically insulating layer 18 of, for example, silicon oxide is formed on surface 12 of substrate 10 between regions 14 and 16. A thin layer of electrically conductive material such as titanium is deposited on the oxide layer 18 to form the gate electrode 20 of the device. The same material forming layer 18 can also be used to form drain and source terminals or contacts 22 and 24 respectively connected to the regions 14 and 16 as well known in the art.

A high positive gate bias potential applied to the gate electrode 20 across layer 18 causes electrons to accumulate at the surface 12 of substrate 10 to form the inversion layer 26 which provides a current channel between the n-type regions 14 and 16. The gradual transition from the degenerate n-type inversion layer 26 to the nongenerate p-type bulk defines the depletion layer 28. It should be appreciated that layers 26 and 28 are defined by electron populations and not physically separate materials as might be otherwise inferred by FIG. 1.

The structure disclosed and discussed in the Tsui et al article is the same as that of FIG. 1 as further modified as illustrated in FIG. 2. Specifically, a gold grating 30 having a period of 3.52 micrometers (distance a in FIG. 2) and a spacing t between each bar or strip of the grating approximately equal to 2.30 micrometers is disposed on the silicon oxide electrical insulating layer 18 to form a source of coherent infrared radiation at a maximum operational temperature of 150° K well below room temperature. For best results the elongated grating strips or bars are disposed on the gate electrode so that their elongated dimension extend perpendicular to the direction of current flow between regions 14 and 16 when a signal is applied to terminals 22 and 24. Plasma oscillations are established in inversion layer 26 by pulsing the source and drain contacts 22 and 24 with pulses, each of 10–100 microseconds in duration at a 1/20 to 1/100 duty cycle to avoid overheating. The emitted power was measured approximately in the order of $10^{-10}$ watts when the source drain field was 10 volts per centimeter. The emission frequency was from 30 cm$^{-1}$ to 50 cm$^{-1}$ depending on the current density of the inversion layer 26.

The collection of electrons in inversion layer 26 is approximately 100 Angstroms thick for a sufficiently high positive voltage applied to gate electrode 20. For physical phenomena involving characteristic dimensions of the surface area (over which the inversion layer is formed) much longer than 100 Angstroms this collection will behave basically as a two-dimensional metal with an adjustable electron surface density $N_S$ (number of electrons per unit area). A two-dimensional collection of electrons has a capability of sustaining density oscillations similar to pressure waves in air. A density oscillation in two-dimensions will have a line-wavefront and a perpendicular direction of phase change. These oscillations, called plasma waves, are standing waves and have a roughly square wave configuration as shown in FIG. 3 where the surface 12 of substrate 10 is defined by the X-Y plane in the drawing. The square wave represents a step-like longitudinal density fluctuation and is the wavelength associated with this fluctuation. This charge density profile oscillates in time with the frequency $\omega$. In developing the theory of operation of the FIG. 2 embodiment the circumstances under which inversion layer 26 oscillates is first determined. As a standing wave, it is required that the electric fields set up by the given charge distribution are driven into oscillation by an AC pulse train applied between the source and drain terminals 22 and 24. The charge distribution changes back and forth as shown in FIG. 3 between the charge distribution shown as solid lines 40 and dotted lines 42 respectively with each cycle of frequency $\omega$. The electric field E of the line charge A with respect to the position of the line Charge B is given by $$E = \frac{(e\, n_s \lambda/2)}{2\pi \epsilon_s} \cdot \frac{1}{\lambda/2} \tag{1}$$

wherein:
e=the electric charge of an electron;
$n_s$=the electron density;
$\lambda$=the wavelength;
$\epsilon_s$=the dielectric constant of the silicon substrate.

This is equivalent to the wavelength independent field given by $$E = \frac{e\, n_s}{2\pi \epsilon_s} \tag{2}$$

An electron in the line charge B will experience a force F that is determined by the following relationship.

$$|F| = eE \tag{3}$$

wherein:
e=the electric charge of an electron; and
E=the electric field.

To simplify the analysis it is assumed that for half the period this force stays constant giving rise to a constant acceleration $$a = \frac{eE}{m} \tag{4}$$

wherein:
m=the mass of an electron.

In order to start with charge distribution 40 and arrive at charge distribution 42 in half the period T, the distance d traveled by the electrons in line charge B must be equal to half the wavelength in half the period T. Accordingly, $$d = \frac{\lambda}{2} = \frac{a(\lambda/W_p)^2}{2} \tag{5}$$

wherein:
a=the acceleration defined by equation (4); and
$W_p$=the oscillation frequency of the two-dimensional plasma waves.

Equation (5) is equivalent to $$W_p^2 = n_s e^2 q / 4m\epsilon_s \tag{6}$$

wherein:
q=the wave number.

Equation (6) is referred to as the dispersion relation of two-dimensional plasma waves. Careful calculations using sophisticated methods of quantum mechanics of many-body systems will give rise to this dispersion relation without the factor of four in the denominator. It should be noted that the tacit assumption has been made that the electrons do not collide with one another or any other external scattering agent as they oscillate back and forth between the positive charge wave crests and the negative charge wave troughs. This is justified since the frequencies of the plasma waves are as low as $10^{11}$ cycles per second, and there are apparently no collision mechanisms which produce the electron scattering times anywhere near $10^{-11}$ seconds. With the above in mind the operational principles of the grating-gated MOSFET and/or heterojunction of FIG. 2 as a voltage tunable source of coherent electromagnetic radiation will now be considered.

Figure 4:
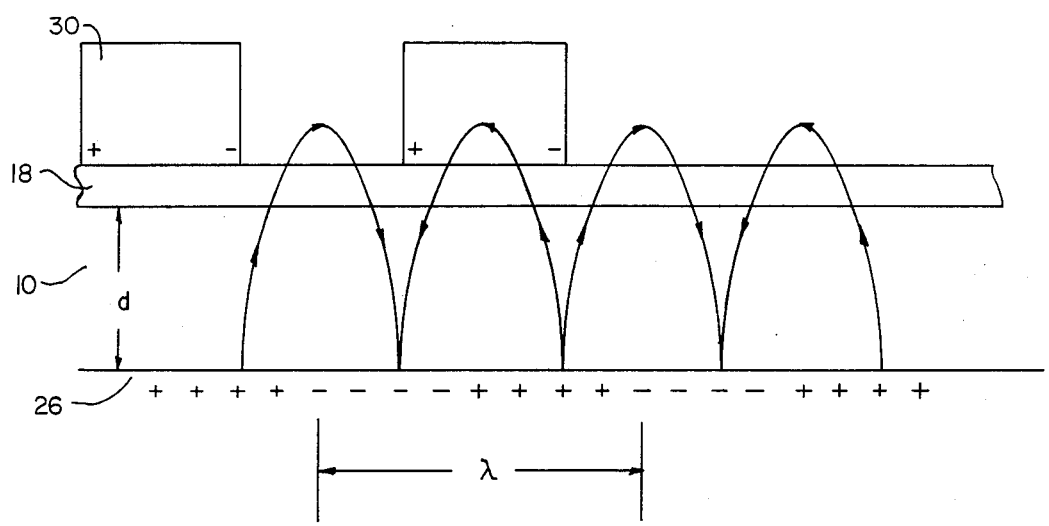
FIG. 4 is a cross-sectional view of the FIG. 2 embodiment showing the coupling by the electric field created by the inversion layer plasmon between the plasmon and electrons in the grating.

A charge density fluctuation in inversion layer 26 will have associated with it electric field which fringe into the insulation layer 18 under the gate electrode 20. Without the gate electrode 20, these fringing fields would extend a distance in the order of a wavelength of charge fluctuation. Since gate electrode 20 is fabricated out of a thin film of metal such as titanium (i.e., the thickness of the electrode is less than the skin depth) electrode 20 can be penetrated by these electric fields. On the other hand, the existence of thick metal strips of grating 30 insures that the grating cannot be penetrated by electric fields. Clearly, the tangential component of the electric field at the surface of the strips of the grating 26 must vanish. This boundary condition thus couples the charge density oscillations in the inversion layer 26 with the electrons in the metal strips of grating 30. Plasma waves with a wavelength equal to that of the period (dimension a as shown in FIG. 2) of the grating will be excited as shown in FIG. 4. Given the wavelength $\lambda$ of a plasma oscillation, its frequency will be determined by the surface density of the electron density $n_s$ if the material parameters are fixed. Thus, a coherent oscillation is critically determined by the existence of a region in inversion layer 26 where the surface charge density is constant. Since it is such an area where the constant electron density will execute charge oscillations coherently, power output is critically determined by the fraction of the total area under the gate electrode 20 that can be ascribed a constant value of the surface density.

Since the surface density of the electrons in the inversion layer is a critical parameter for the coherent operation of the FIG. 2 device, those factors determining the value of the surface density at each point under the gate electrodes 20 must be taken into consideration.

Figure 5:
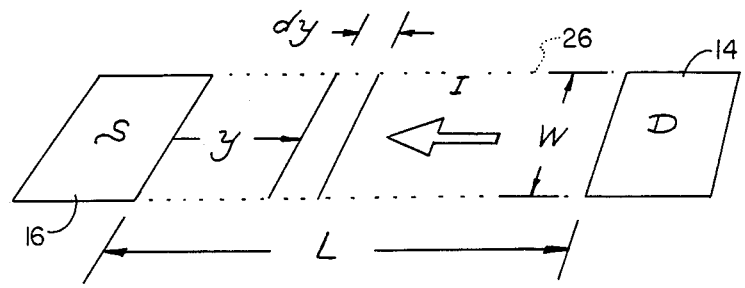
FIG. 5 is a two-dimensional illustration of the electron channel defined by the inversion layer of electrons in the FIG. 2 embodiment.

In FIG. 5, the relationships of the source and drain regions 14 and 16 and the length L and width W of the channel defined by inversion layer 26 are shown. If the dimension W is sufficiently wide, then the end effects along the edges of inversion layer 26 will only cover a small fraction of the area of the entire inversion layer. It can be expected, therefore, that the incremental resistance dR of an elemental length dy will be determined by the distance y only. If the sheet conductivity of the inversion layer 26 is defined as $\sigma(y)$, then the incremental resistance of the element is given by, $$dR(y) = \frac{1}{\sigma(y)} \frac{dy}{W}. \tag{7}$$

In FIG. 5, the conventional current $I_D$ flows in the negative y direction. The voltage change is positive as y increases by dy and is given by $$dV(y) = I_D \frac{dy}{\sigma(y)W} \tag{8}$$

In equation (8) the sheet conductivity can be defined as follows $$\sigma(y) = -[Q_n(3y)\mu_n] \geq 0; \tag{9}$$

wherein:
$Q_n(y)$ = the surface charge density of channel electrons at y (coulombs/meter$^2$) $Q_n(y) < 0$; and
$\mu_n$ = the mobility of the electrons (meters$^2$/volt-second).

The total charge $Q_s(y)$ induced in the gate electrode 20 is the image of the surface charge density $Q_n(y)$ in the inversion layer 26 plus the fixed charges $Q_B(y)$ in the depletion layer 28, or, $$Q_s(y) = Q_n(y) + Q_B(y) \tag{10}$$

The gate electrode 20 thus in part defines two effective capacitors each in series with one another. The first capacitor is charged up by the electrons of inversion layer 26 and the other is charged up by the fixed charges in depletion layer 28. Assuming that $Q_s(y)$ is the total charge of a single fictitious capacitor, and the voltage of $V_G$ and $V_s$ are applied to the plates of such a capacitor the following relationship exists;

$$V_G - V_s = -\frac{Q_s(y)}{C_o} \tag{11}$$

wherein:
$C_o = \epsilon_{ox}/d$ where d is the thickness and $\epsilon_{ox}$ is dielectric constant of the substrate 10.

In fact the surface potential, $V_s$ is determined by $V_G$. The latter in turn is measured with respect to the flat band voltage $V_{FB}$. The flat band voltage is a built-in gate bias due to fixed oxide charges in substrate 10. Thus, $$V_G - V_s(y) = V_G - V_{FB} - V_s(y) = -\frac{Q_s(y)}{C_o} \tag{12}$$

In Eq. 10 the charge $Q_B(y)$ is the integrated net surface charge in the depletion layer. Its value is obtained in the following simplified manner.

Figure 6A:
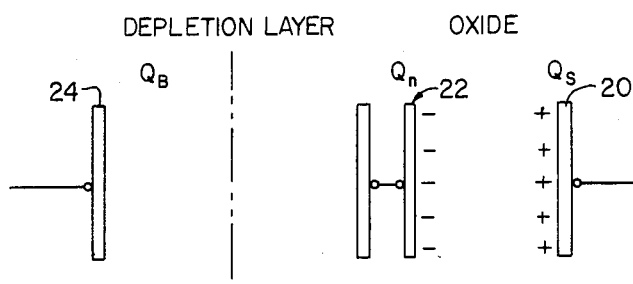
FIG. 6A and 6B show the capacitive relationships between the gate electrode and each of the inversion and depletion layers of the FIG. 2 embodiment.
Figure 6B:
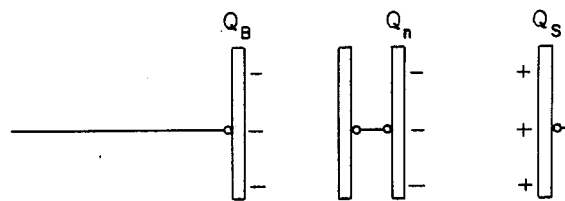

Referring to FIG. 6A, the two fictitious capacitors are illustrated in relationship to gate electrode 20 and each of the inversion layer 26 and depletion layer 28. The thickness d of depletion layer 28 is the distance between two capacitor plates. The thickness of the insulation layer 18 is $d_{ox}$ while the dielectric constant of the depletion layer is $\epsilon_s$ and the dielectric constant of the layer 18 is $\epsilon_{ox}$. The charge on one of the plates is assumed to be distributed evenly throughout the entire insulator defining depletion layer 28 as a volume charge. If an evenly distributed volume charge is assumed throughout depletion layer 28, it is equivalent to reducing the entire volume distributed throughout the depletion layer to a sheet charge right in the middle of the insulator, i.e., at a distance of d/2 away from the other plate as illustrated by FIG. 6B. Using the model of FIG. 6B, the total charge q distributed throughout the insulator per unit area is given by;

$$q = ned \tag{13}$$

wherein:
n = the volume density of charge distribution; and
e = the electric charge of an electron; and
d = the thickness of the depletion layer. And further, $$q = VC = V\epsilon/(d/2) \tag{17}$$

wherein:
V = the applied voltage on one plate with respect to the other;
C = the effective capacitance provided by the capacitor, and
$\epsilon$ = the dielectric constant of the effective capacitance.

Solving these expressions for d yields, $$d = \frac{2V\epsilon}{ne} \tag{15}$$

In the case of depletion layer 28, n would be the volume density of the acceptors $N_A$, and V would be the surface potential with respect to the bulk material of substrate 10, i.e., $V_s$. The charge $Q_B$ therefore becomes, $$Q_B = \sqrt{2V_s(y)\epsilon_s N_A e} \ . \tag{16}$$

This simple approach gives the charge per unit area in depletion layer 28 due to the bulk doping in a simplified manner; thus, $$Q_n(y) = -[V_G - V_{FB} - V_s(y)]C_o + \sqrt{2\epsilon_s e N_A V_s(y)} \ . \tag{17}$$

Relative to the bulk material of substrate 10, the surface potential is, $$V_s(y) = V(y) + 2V_{FP} \tag{18}$$

wherein:
$V_{FP}$ represents the Fermi level of the bulk material.

For strong inversion one assumes that the Fermi level is equidistant to the conduction band edge at the surface and the valance band edge in the bulk material. Thus, as expression is provided for $Q_n(y)$ as a function of the surface potential $V_s(y)$, or the V(y), the voltage with respect to the source. Combining equations (8), (11) and (12) results in, $$\frac{dV}{dy} = \frac{I_D/W\mu_n}{+ C_o[V_G - V_{FB} - V(y) - 2V_{FB}] - \sqrt{2\epsilon_s e N_A[V(y) + 2V]}} \tag{19}$$

wherein:
$I_D$ = drain current,
$\mu_n$ = the mobility of the electrons,
$C_o$ = the capacitance of the oxide,
$V_G$ = the voltage of the gate,
$V_{FB}$ = the flat band voltage,
V(y) = the voltage of the line at a distance y from the source,
$V_{FP}$ = the Fermi potential,
$\epsilon_s$ = the dielectric constant of the semiconductor,
e = electronic charge, and $N_A$ = volume density of the acceptors,
W = width of channel defined by the inversion layer.

It is noted that the quantity dV/dy is the absolute value of the electric field at a distance y from the source. This electric field is directed from the drain to the source so that the electrons move from the source to the drain giving rise to the conventional electric current from the drain to the source.

Equation (19) can be used to calculate the theoretical current voltage relation ship of a MOSFET and/or heterojunction as a function of gate voltage by integrating equation (19) over the length of the channel formed by inversion layer 26 for a range of drain voltages from zero to $V_D$. Specifically, $$I_D \int_0^L dy = \int_0^{V_D} dVg(V, V_G) \quad (20)$$

yielding $$I_D = \frac{1}{L} f(V_D, V_G) \quad (21)$$

wherein:
f is the indefinite integral of the function g. I.E., $f(V_D, V_G) = \int g \, dv$.

Although the explicit form of $f(V_D, V_G)$ is unimportant, it appears to be the current voltage relationship of a MOSFET and/or heterojunction parametrized by the gate voltage and is given by, $$I_D = \frac{W}{L} \mu n\, C_o \left\{ \left[ V_G - V_{FB} - 2V_{FP} \frac{-V_D}{2} \right] V_D \frac{-2}{3} \frac{2\epsilon_s e N_A}{C_o} [(V_D + 2V_{FP})^{3/2} - (2V_{FP})^{3/2}] \right\} \quad (22)$$

where the notation used has been defined in connection with equation (19) above.

Figure 7:
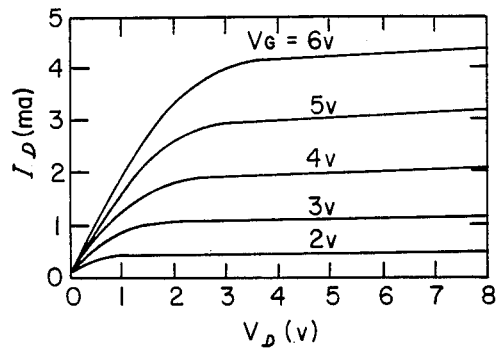
FIG. 7 is a graphical illustration of the experimental current-voltage characteristics of the n-channel MOSFET and/or heterojunction.

The important aspect of equation (22) is displayed in FIG. 7. The drain voltage characteristics of a MOSFET transistor is well known and its form enables one to extract the information contained in equation (19) in a precipitous way.

For purposes of analysis equation (19) is integrated not to L (i.e. from the source to the drain), but to a specific point in the channel signified by y=Y where the local voltage V=V(Y). Thus, the integration equation (19)

$$yI_D = f(V[y], V_G) \quad (23)$$

The surface potential $V_s$ is thus provided as a function of y between the source and the drain contacts 22 and 24 of the channel formed by inversion layer 26. Once $V_s(Y)$ is known, the electrons in the channel formed by the inversion layer as a function of y is known by virtue of equation (16).

The surface density of the electrons in the inversion layer is thus a critical parameter for the coherent operation of this device.

Figure 8:
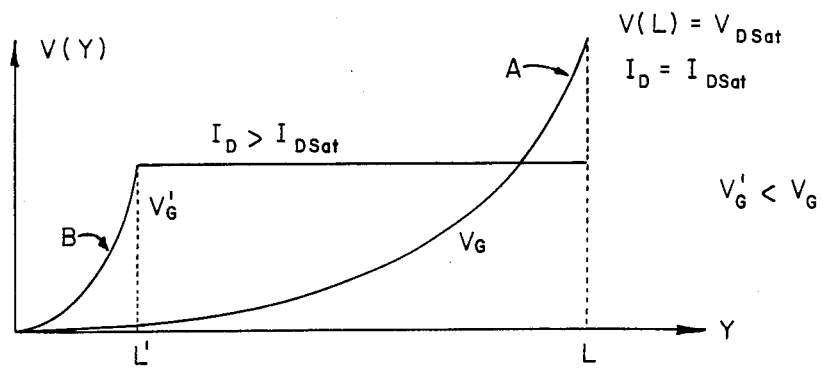
FIG. 8 is a qualitative graphical illustration of the voltage along the inversion layer channel as a function of distance from the source terminal.

Clearly the functions V(Y) and $V_D(I_D)$ have the same form. If $I_D=I_{DSAT}$, then $V_L=V_{DSAT}$. This case is shown as A in FIG. 8 wherein the functions V(Y) and $V_D(I_D)$ are plotted.

For a given gate voltage, the saturation current, which is given by the maximum point of the current-voltage characteristic expressed as equation (22) can be calculated. After this voltage is reached the current stays substantially constant for all practical considerations. (In practice, for voltages higher than the saturation voltage there is actually a slight increase in the drain current which is related to the junction between the channel and the drain, c.f., FIG. 7. However, that matter is left entirely outside the scope of this model.) Therefore, for all voltages above the drain saturation voltage $V_{DSAT}$, the drain current remains substantially constant. Equation (22) will actually give a decreasing current for voltages above the drain voltage. However, in that region equation (22) does not describe the model since it predicts a negative number density. It should be observed that when the saturation voltage $V_{DSAT}$ is applied to the drain, the drain current is given by $I_D = I_{DSAT}$, and infinite slope of V(y) at y=L is provided.

As noted above, if a drain voltage greater than the saturation voltage is applied, then a current slightly greater than the saturation current will pass through the channel formed by the inversion layer 26. Accordingly, the function V(Y) will reach its maximum point at a distance y which is less than L. The passage of a current $I_D$ greater than $I_{DSAT}$ will move the point where saturation is reached to a position $Y_{SAT}=\bar{L}$, the latter being less than L, such that $I_D\bar{L}=I_{SAT}L$ where $I_D$ is greater than $I_{DSAT}$. This situation is shown as B in FIG. 8.

Ideally, at the saturation point there are no free electrons in the channel formed by the inversion layer 26. The gate charges then are the images of the fully reserve biased depletion layer 28. This idealization, however, has no physical meaning since no current can flow at the point where there are no mobile charges. This fact rules out the flow of an electric field driven current.

A little reflection will show that no diffusion current is possible at this point either. Accordingly, at this point the theoretical model breaks down. As a matter of fact the actual model does not actually include this point.

The dependence of the voltage on position can be demonstrated by plotting equation (23) at a fixed gate voltage. Using that information and equations (17) and (18), the surface charge density can be calculated as a function of position along the channel. The relationship between the V(y) and Q(y) must obey the consistency rule, that rule requiring that, $$J_D = \frac{I_D}{W} = -Q_n(y)\mu E(y) = Q_n(y)\mu \frac{dV(y)}{dy} \quad (24)$$

wherein:
$J_D$ = surface current density in the channel of width W,
E(y) = electric field at position y,
$\mu m$ = mobility of the electrons in the channel, and
dV(y)/dy is given by equation (19).

Figure 9:
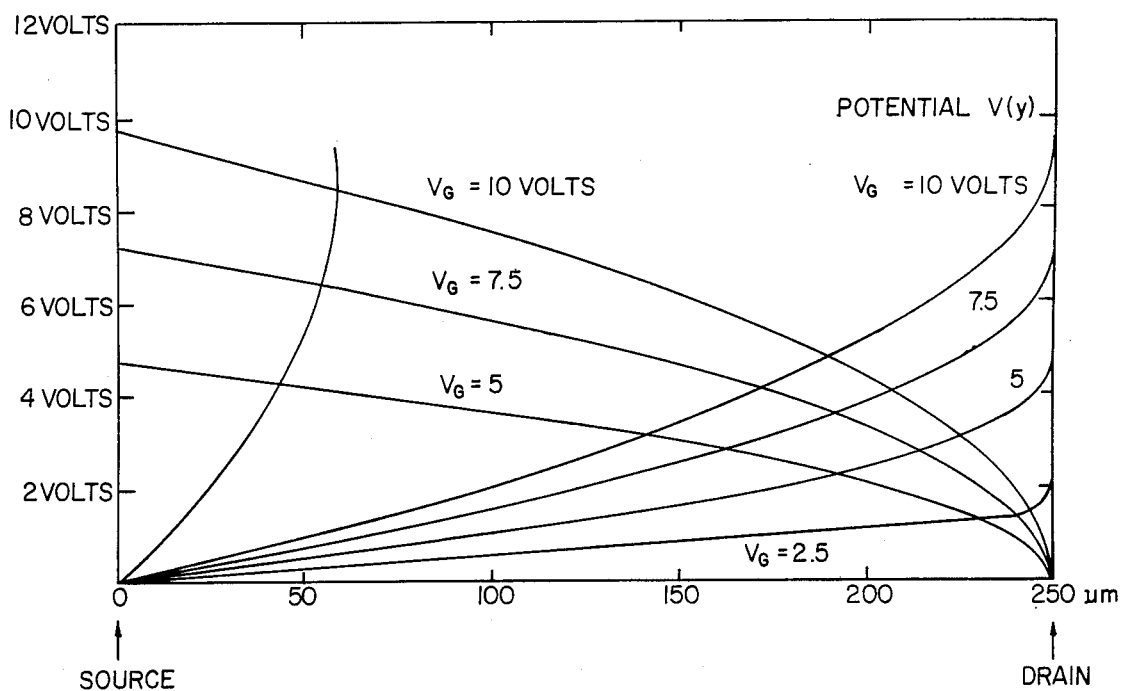
FIG. 9 is a graphical plot of area charge density and voltage as a function of distance from the source terminal for the device shown in FIG. 2.

In FIG. 9 the graphs of channel charge and channel potential, each as a function of position, have been displayed. In the computation of the graphs, device parameters from the experiment described in Tsui et al article (identified above) have been used. Whenever no direct information is available, typical and representative values have been utilized. For higher gate voltages, the high field region (where E(y) is much larger than 0) penetrates into a higher channel charge density region in a direct relation with the increasing value of the saturation current.

Figure 10:
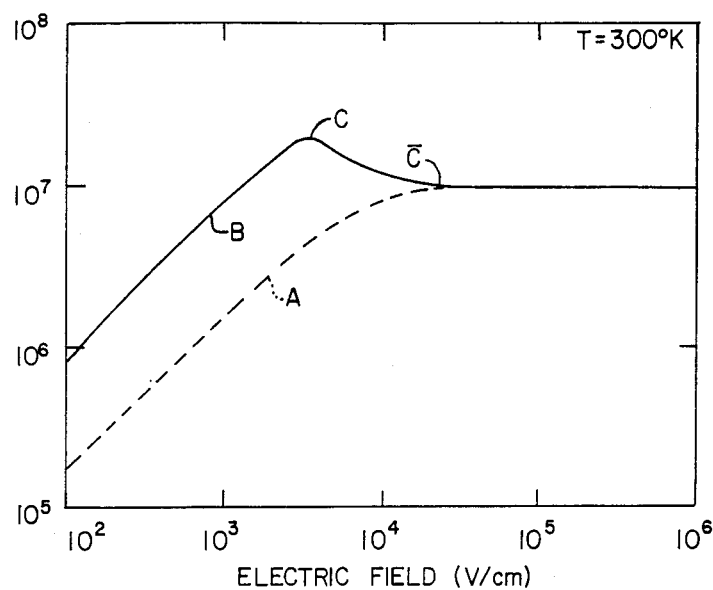
FIG. 10 is a graphical representation of the measured electron velocity vs. electric field for high purity silicon of the prior art and gallium arsenide of the preferred embodiment.

With values of the electric field below $2\times10^4$v/cm, the mobility of electrons for high purity silicon at room temperature does not appreciably depend on the electric field (FIG. 10). In short, drift velocities are directly proportional to electric fields. However, at about $2\times10^4$v/cm the drift velocity of the carriers saturate. Any further increase in the electric field cannot increase the drift velocity because of the existence of very efficient energy loss mechanisms Hence, the electron reaches a "terminal drift velocity". In this regime the product $dV(y)/dy$ becomes a constant independent of electric fields which reaches an upper limit. That point of the channel where the high field limit might have been reached is referred to hereinafter as the coordinate $Y_{hf}$. All points with y greater than or equal to $Y_{hf}$ are characterized by $Q_n(Y)$=constant as shown at A in FIG. 11.

In short, by choosing a high enough gate voltage the high field point $Y_{hf}$ will be reached in the channel when a sufficiently high drain voltage is applied. Hence, this will insure the existence of a region of the channel having a constant surface charge density. Thus a well-defined and simple technique is developed by which the critical value of the gate voltage can be calculated below which no emission of radiation can take place by creation and decay of plasma oscillations Furthermore, any additional increase of the gate voltage (and saturation current), the region fulfilling the critical condition of having a constant surface charge density can be made larger and the constant value of the charge density can be made to reach a higher value. It is this value which determines the square of the frequency of the emitted radiation. The ability to regulate and determine its value is equivalent to controlling the operation of the device.

Referring again to FIG. 11 the dotted lines refer to field-independent mobility while the solid lines refer to the situation where velocity saturation is qualitatively included to describe the behavior of the silicon based MOSFET and/or heterojunction device of FIG. 2. The graphs demonstrate the following simple physical picture. The resistivity of each point in the channel is inversely proportional to the charge density at that point. Therefore, across the areas of high charge density there is a relatively small voltage drop. Most of the voltage applied across the channel appears across the region near where velocity saturation conditions occur. Remembering that the high field point $y_{hf}$ obtained in the resistance region of the drain gives rise to a constant density of channel charge, it is obvious that the device should be operated with a highly resistive area in the channel near the drain.

Summarizing, the operation principles of the grating-gated MOSFET and/or heterojunction as a voltage tunable source for coherent electromagnetic radiation, the region defined by $y_{hf} \leq y \leq L$ has a constant charge density. Therefore, this region is characterized by a single frequency plasma oscillations. Conversely, in the interval $0 \leq y \leq y_{hf}$ there is a range of densities and therefore not a unique frequency oscillation. Since plasmons are collective excitations, the natural oscillations of the constant density region will be damped wherever there is a different surface concentration. This will give rise to an increased dissipation and an increased bandwidth of the device. Once a reasonably long region of constant density is achieved, the excitation of the plasma oscillations in the silicon based device remains as the main outstanding problem. In the Tsui et al reference cited above, this was achieved by pulsing the source-drain voltage. The most significant result of a change of the source-drain voltage would no doubt be the shift of the point $y_{hf}$. This would be associated with a corresponding readjustment of all the mobile charges in the channel.

As previously described the total charge per unit area in the gate electrode is the image of $Q_s(y)$ which is defined by equation (12). Hence, in the steady-state operation of the channel, the charge per unit area of the gate electrode is not uniform. This of course is not a permissable steady-state for the metal electrode of the Tsui et al silicon-base structure since metals cannot sustain internal electric fields. The surface charge would redistribute itself until the electric field lines are everywhere normal to the plane of the metal gate. A sudden change in the drain voltage of a device which is being operated in the saturation region would change the function V(y) everywhere along the channel. The new potential function $\overline{V}(y)$ can be consistent only with a different charge distribution on the gate electrode. In short, a readjustment of the $Q_s(y)$ will be accompanied by a readjustment of the image charge distribution on the gate electrode, thus, giving rise to surface currents on the gate electrode. A surface current on the gate electrode would, in turn, give rise to a periodic voltage drop along the gate electrode. Most of the voltage drop would appear across the grating spacings since the grating strips of grating 30 can be assumed to have a relatively large value of conductivity. If an instantaneous plot of the electric field is made as a function of position along the gate electrode, it can be shown that it has alternating regions of zero and high fields. The zero fields correspond to the spaces immediately underneath the grating bars and the high field regions correspond to the areas between them. Next, if the channel electrons within this instantaneous electric field are considered, it can be shown that they would be perturbed to give rise to a plasma oscillation where the wavelength would be equal to that of the spatial periodicity of the grating.

The reported observation of emission of coherent radiation from a large area silicon base MOSFET and/or heterojunction having a gold grating by Tsui et al, is not suitable for commercial applications. The excitation has been achieved by the AC pulsing of the source-drain voltage which necessitates the use of an external electronic pulsing system in connection with the device and the observation was made at liquid helium temperatures.

Not having been equipped with a theory explaining the phenomenon Tsui et al were not able to develop a system such that the device would be self-exciting. Furthermore, theory shows that for the long wavelength region of the electromagnetic spectrum, the Silicon substrated MOSFET and/or heterojunction would have a maximum operation temperature of 150° K.

In accordance with the present invention, a self-exciting device operable at room temperatures is provided by substituting a gallium arsenide substrate for the silicon-substrate of the FIG. 2 embodiment. The term self-exciting in this context means that the plasma oscillation occurs in response to a substantially constant DC current flowing through the channel. Such an unexpected result is potentially achieved due to a basic current instability in gallium arsenide referred to as the Gunn Effect. More particularly, referring again to FIG. 10, the drift velocity for both silicon and gallium arsenide are shown, each as a function of electric field. The drift velocity of an electron in silicon, shown by curve A increases monotonically with increasing electric field reaching a "terminal drift velocity" at an electric field of about $2 \times 10^4$ volts/cm. However, gallium arsenide, the drift velocity, shown by curve B, first reaches a higher maximum value and then decreases to approximately the same "terminal drift velocity" at approximately the same strength field. This quality of the dependence of the drift velocity on electric field constitutes the Gunn Effect.

Figure 11:
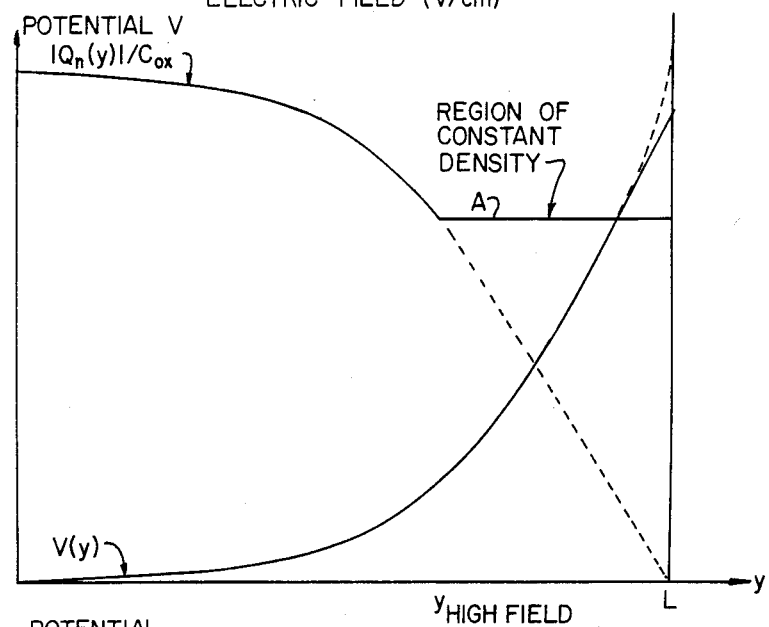
FIG. 11 graphically illustrates a qualitative plot of equation (11) and equation (18) described hereinafter, both as functions of distance along the current channel between the source and drain terminals of a silicon based MOSFET and/or heterojunction.
Figure 12:
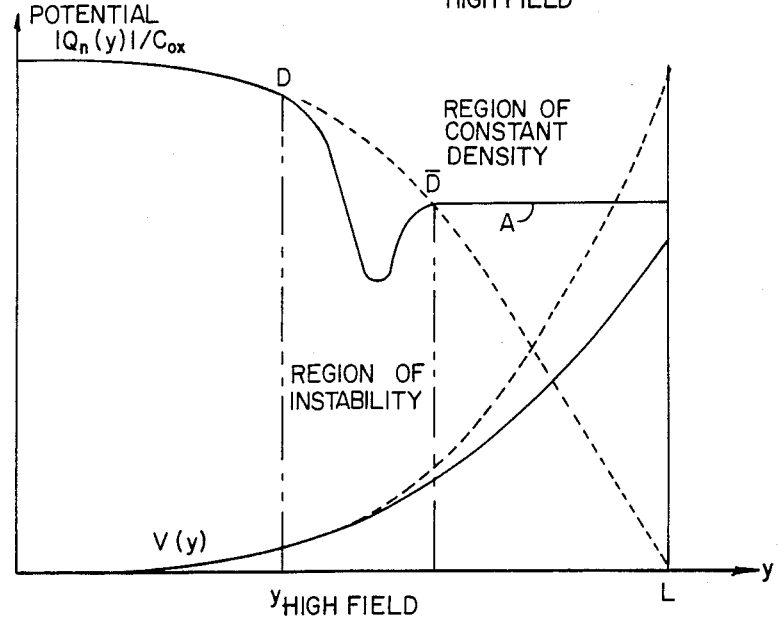
FIG. 12 graphically illustrates a qualitative plot of equation (11) and equation (18), both as functions of distance along the current channel between the source and drain terminals of the preferred embodiment of the present invention.

More particularly, a steady-state charge profile along the channel is obtained as shown in FIG. 11 due to the field dependence of the drift velocity for silicon as shown in FIG. 10. Comparing the functional form of the drift velocity in silicon with that of gallium arsenide, the naive approach would lead to the charge profile shown in FIG. 12. A dip in charge density in FIG. 12 shows between points D and $\overline{D}$ correspond to the portion of the curve B shown in FIG. 10 between points C and $\overline{C}$. However, due to the negative differential resistance between C and $\overline{C}$, the region D and $\overline{D}$ is unstable. A simple analysis involving a direct qualitative solution of Poisson's law with a given charge distribution and the local application of Ohm's law would show that any deviation from the steady-state shown in FIG. 12 would grow in time leading to an instability. This instability would give rise to an oscillation of the charge density in the channel. This, in turn, would give rise to surface currents in the gate electrode metal which, in turn, would excite the proper plasma waves. The latter would be picked up by the period of the grating spacing. Thus the device is self-exciting.

Secondly, the bandwidth characteristics of the coherent source is predictably improved by the use of gallium arsenide as the substrate material of substrate 10.

This can be demonstrated by the following analysis:

The two important characteristics of a plasma are the ratio $\Gamma$ of its electrostatic potential energy e to the kinetic energy particle p and the statistics it obeys. Specifically, $$\Gamma = \frac{e^2/\epsilon r_s}{p^2/2m} \quad (25)$$

wherein:
$\epsilon$ = dielectric constant of the medium in which the plasma is formed;
$r_s$ = average interparticle separation; and
m = band mass of the particles.

In two dimensions the average interparticle spacing $r_s$ can be related to the density by, $$(n_s)^{-1} = \pi r_s^2 \quad (26)$$

wherein:
$n_s$ = surface density of the particles

The kinetic energy per particle is the Fermi energy $E_f$. It is therefore straightforward to relate the density and the Fermi energy. Starting with the density $\rho$ of the allowed points in the K space for the electrons, $$\rho = V/(2\pi)^2 \quad (27)$$

wherein
V = the volume of the space
The area of the Femi sea in two dimensions is given by $$a = \pi K_F^2$$

wherein:
$K_F$ is the Fermi wave-vector.

Since there are two electrons per allowed point the total number of electrons is defined as:

$$N = 2 \frac{V}{(2\pi)^2} \pi K_F^2 \quad (28)$$

or $$n_s = \frac{K_F^2}{2\pi} \quad (29)$$

Since $$E_F = \frac{\hbar^2 K_F^2}{2m} \quad (30)$$

wherein:
is Planck's constant; and
m is the mass of electrons; then $$n_s = \frac{mE_F}{\hbar^2} \quad (31)$$

Therefore, $$E_F = \frac{\hbar^2 \pi n}{m} s \quad (32)$$

An interesting conclusion can be drawn from equation 30. The Fermi energy is directly proportional to the number density. This means that as the number density increases, since the inter-atomic spacing decreases in proportion to the inverse of $r_s^2$ the Fermi energy is therefore just the localization energy for these particles due to localization within a distance of $r_s$. It is cutomary to measure the Fermi energy in terms of an equivalent temperature ($T_f$) as defined as follows:

$$E_F = K_B T_F \quad (33)$$

wherein $k_B$ is the Boltzman constant.

If the system is in thermal equilibrium with the heat bath at a temperature below the Fermi tempeature $T_F$, then the system is degenerate, i.e., its quantum properties are non-negligible. On the other hand, if the temperature of the system is at its Fermi temperature, then the plasma is described approximately by the Maxwell-Boltzman statistics as though the system is classical.

Using equations 31 and 32, the Fermi temperature is given by, $$T_F = \hbar^2 \pi n_s / m K_B, \quad (34)$$

For the (100) surface of the silicon crystal of the prior art and a surface density of $n_s = 10^{12} cm^{-2}$, the Fermi temperature is about 150° K. This means that below this temperature, the electrons constitute a quantum collection. On the other hand, since gallium arsenide has a much lighter effective mass the Fermi temperature for gallium arsenide at the same surface concentration is at about room temperature. With both silicon and gallium arsenide, $\Gamma$, the ratio of the electrostatic potential energy to kinetic energy is much less than one indicating a weak coupled system. Referring to the expression giving the surface density as a function of energy $\rho(E)$ we see that the density of the energy states is independent of energy and given by $$\rho(E) = \frac{\delta n_s}{\delta E} = \frac{m}{\hbar^2 \pi} \quad (35)$$

This has a stabilizing effect on the location of the Fermi level as temperature is varied. The Fermi level is thus "pinned" under changing temperature.

With this information the number of particles, n, available for thermal fluctuations at a given temperature T can be estimated as $$\Delta n = \frac{M}{\hbar^2 \pi} K_B T \quad (36)$$

In order to calculate the bandwidth of the plasma oscillations the dispersion relation of the plasmons is first approximately described as follows:

$$\omega p^2 = n_s e^2 q / m \epsilon_s \quad (37)$$

wherein:
$\omega_p$ = plasma frequency
$n_s$ = electron density
e = the electronic charge
q = the wave vector
m = the electronic mass
$E_s$ = the electronic field Differentiating this expression with respect to $n_s$ and using the previous equation (37)

$$\frac{\Delta \omega}{\omega} = \frac{m K_B T}{2\pi \hbar^2 n_s} \quad (38)$$

wherein
$\Delta \omega$ = the bandwidth
107 = the plasma frequency
m = the mass
$k_B$ = Boltzman's constant
= Planck's constant
$n_s$ = the average density of electrons
T = the temperature Equations (37) and (38) spell out the design considerations for a particular device.

To design a device with a desired wavelength of the emitted radiation, the angular frequency of the photon $\omega_{em}$ is calculated by the expression, $$\omega_{em} = \frac{2\pi c}{\lambda_{em}} \quad (39)$$

wherein:
c = velocity of right; and
$\lambda_{em}$ = the emitted wavelength.

The emitted electromagnetic radiation and the source plasma wave must have the same angular frequency, so that;

$$\omega_p = \omega_{em} \text{ or } \left(\frac{n_s e^2 q}{m \epsilon_s}\right)^{1/2} = \frac{2\pi c}{\lambda_{em}}. \quad (40)$$

Equations (37), (38), (39), and (40), therefore determine the design parameter as, $$\lambda_{em} = \frac{2\pi c}{e} \left(\frac{m \epsilon_s}{n_s g}\right)^{1/2} \quad (41)$$

wherein:
q = $2\pi/a$ with a representing the spatial periodicity of the grating.

For a given $\lambda_{em}$ a smaller value of $m/n_s$ can be compensated by a larger spacing a corresponding to a smaller q. Hence, the normalized bandwidth given by equation (38) can be minimized by choosing a material with a small effective mass. Here, gallium arsenide is clearly an advantageous material to use because, $$m_{GaAs} = 0.068 M_o \quad (42)$$

in contrast to silicon where, $$m_{si} = 0.2 m_o \quad (43)$$

where $m_o$ is the mass of an electron.

By the same token, equation 31 shows that the system within gallium arsenide environment stays as a quantum collection up to more than twice the absolute temperature appropriate for silicon. This covers room temperature operation.

While the invention has been described as using a gallium arsenide substrate, other materials can be used for the substrate such as indium antimonide, indium phosphide and still provide a self-exciting source of substantially coherent radiation operable near or at room temperature.

When designing a source in accordance with the present invention a, the grating period, is determined according to equation (41). The source-drain voltage is preferably determined by the following steps:

I. Tabulate the saturation currents and saturation drain-voltages as a function of gate voltage. For each case calculate the value of the product of the length of the channel and the drain current.

II. Looking at the voltage characteristics of the actual device, observe the increase of the drain current after the onset of saturation as a function of the increasing drain voltage.

III. Remembering that the product of the drain current and the channel length is a constant, an increased saturation current would give rise to a smaller effective channel length. From this calculate the effective channel length for a set of drain voltages about the saturation voltage.

IV. Calculate the difference of the actual channel length and the effective channel length. When the actual channel length L minus the effective channel length L is greater than (a) the spatial periodicity of the grating a, the spatial threshold for the minimum drain voltage for photon emission has been passed.

V. Operate the device at sufficiently high gate voltage and sufficiently high drain voltage above the saturation drain voltage to increase area of coherent emission. The limits of this will be determined by the fabrication and packaging processes of the device so that maximum amount of heat can be removed from the device.

The source of coherent radiation thus described provides a substantial improvement over the Tsui et al device since the present invention provides a device which is self-exciting so as to eliminate the need for additional drive circuit, and is operable at room temperature so that the device has far wider applications. In addition, the power output as well as the bandwidth of the grated MOSFET and/or heterojunction having a gallium arsenide, indium antimonide or indium phosphide substrate according to the present invention is greater than that provided by an identical structure with a silicon substrate as suggested by Tsui et al.

Since certain changes may be made in the above product without departing from the scope of this invention herein involved, it is intended that all matter contained in the above description or shown in the accompanying drawing shall be interpreted in an illustrative and not in a limiting sense.

What is claimed is:

1. A source of substantially coherent radiation, said source comprising:

means for forming a thin layer of electrons said means for forming electrons comprising a p-type substrate selected from the group consisting of gallium arsenide, indium antimonide and indium phosphide having at least two n-type portions diffused into a surface of said substrate, an insulation layer of electrically insulative material disposed on said surface between said portions and a thin layer of electrically conductive material disposed on said insulation layer, wherein said layer of electrons is formed at said surface in response to a potential applied to said thin layer so that electrons in said substrate are attracted toward said thin layer to said surface of said substrate;

grating means spaced from said thin layer of electrons; and means for obtaining a substantially constant DC charge through said thin layer of electrons wherein at least a portion of said thin layer of electrons oscillates responsively to said DC charge to provide a plasma wave, said grating means being spaced from said plasma wave such that electrons in said grating means couple with said plasma wave so as to emit said coherent radiation.

2. A source according to claim 1, wherein said means for obtaining a substantially constant DC charge includes terminal means connected to each of said n-type portions so that a direct current can flow therebetween.

3. A source according to claim 2, wherein said grating means includes a plurality of thin strips of electrically conductive material disposed on said thin layer, said strips being disposed in their elongate direction substantially perpendicular to the flow of said current.

4. A source according to claim 2, wherein the operating temperatures at which said coherent radiation is emitted is at least less than about 100° F.

5. A source according to claim 4, wherein said coherent radiation is in the far infrared portion of the electromagnetic spectrum.

6. A source according to claim 5, wherein the wavelength of said coherent radiation is a function of the area of said layer of electrons exhibiting a constant charge density, and the level of said direct current.

7. A source according to claim 5, wherein said DC charge applied to said thin layer and said direct current are at sufficiently high amplitudes so that current saturation of said layer of electrons is exceeded.

* * * * *